(12) United States Patent
Leonardi et al.

(10) Patent No.: US 7,674,694 B2
(45) Date of Patent: Mar. 9, 2010

(54) PROCESS FOR MANUFACTURING A TFT DEVICE WITH SOURCE AND DRAIN REGIONS HAVING GRADUAL DOPANT PROFILE

(75) Inventors: Salvatore Leonardi, Aci S. Antonio (IT); Salvatore Coffa, Tremestieri Etneo (IT); Claudia Caligiore, Giarre (IT); Guglielmo Fortunato, Rome (IT); Luigi Mariucci, Rome (IT); Massimo Cuscuna, Rome (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 107 days.

(21) Appl. No.: 12/031,456

(22) Filed: Feb. 14, 2008

(65) Prior Publication Data
US 2008/0213961 A1 Sep. 4, 2008

(30) Foreign Application Priority Data
Feb. 14, 2007 (IT) .......................... MI2007A0271

(51) Int. Cl.
H01L 21/20 (2006.01)
H01L 21/36 (2006.01)

(52) U.S. Cl. ...................... 438/508; 438/149; 438/510; 438/679; 257/E21.17; 257/E21.051; 257/E21.058; 257/E21.304; 257/E21.347

(58) Field of Classification Search ................ 438/149, 438/197, 508, 510, 553, 308, 301, 679, 736
See application file for complete search history.

(56) References Cited

U.S. PATENT DOCUMENTS 5,913,119 A * 6/1999 Lin et al. .................... 438/255
6,046,083 A * 4/2000 Lin et al. .................... 438/255
6,716,713 B2 * 4/2004 Todd .......................... 438/369
7,310,358 B2 * 12/2007 Chua et al. .................... 372/23
2007/0190466 A1 * 8/2007 Lee et al. .................... 430/320
2007/0246793 A1 * 10/2007 Van Gompel et al. ....... 257/499

OTHER PUBLICATIONS

Cuscuna, M. et al., "A novel fabrication process for polysilicon thin film transistors with source/drain contacts formed by deposition and lift-off of highly doped layers," Solid-State Electronics 46:1351-1358, 2002.

Fortunato, G. et al., "Comparative analysis of advanced polysilicon thin-film transistor architectures for drain field relief," SPIE, 5004:150-164, 2003.

Pichon, L. et al., "Thin film transistors fabricated by in situ doped unhydrogenated polysilicon films obtained by solid phase crystallization," Semiconductor Science and Technology 16:918-924, 2001.

* cited by examiner

*Primary Examiner*—David Nhu
(74) *Attorney, Agent, or Firm*—Lisa K. Jorgenson; Robert Iannucci; Seed IP Law Group PLLC

(57) ABSTRACT

A process for realizing TFT devices on a substrate comprises the steps of: forming on the substrate, in cascade, an amorphous silicon layer and a heavily doped amorphous silicon layer, forming a photolithographic mask on the heavily doped amorphous silicon layer provided with an opening, removing the heavily doped amorphous silicon layer through the opening for realizing opposite portions of the heavily doped amorphous silicon layer whose cross dimensions decrease as long as they depart from the amorphous silicon layer, removing the photolithographic mask, carrying out a diffusion and activation step of the dopant contained in the portions of the heavily doped amorphous silicon layer inside the amorphous silicon layer, for realizing source/drain regions of said TFT device.

29 Claims, 11 Drawing Sheets

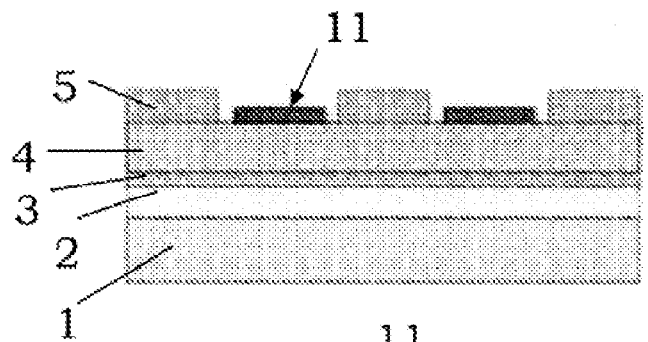
FIG. 1E
(Prior Art)
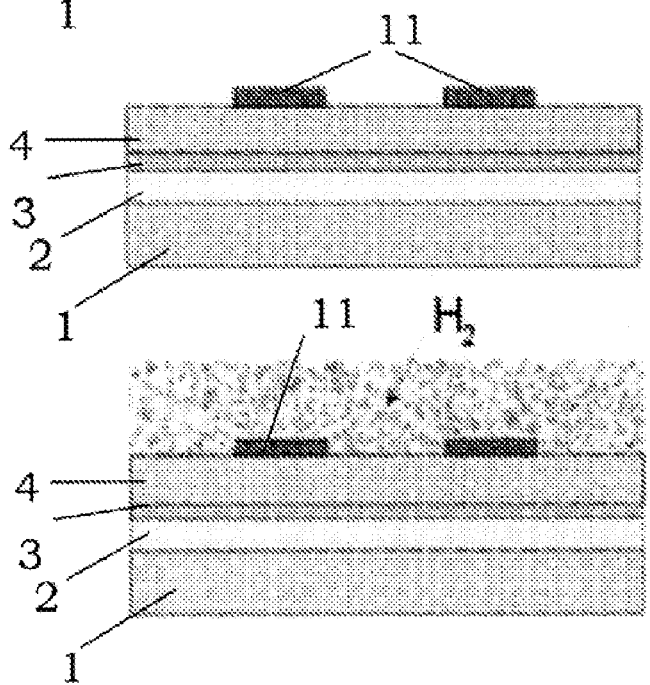
FIG. 1F
(Prior Art)
FIG. 1G
(Prior Art)
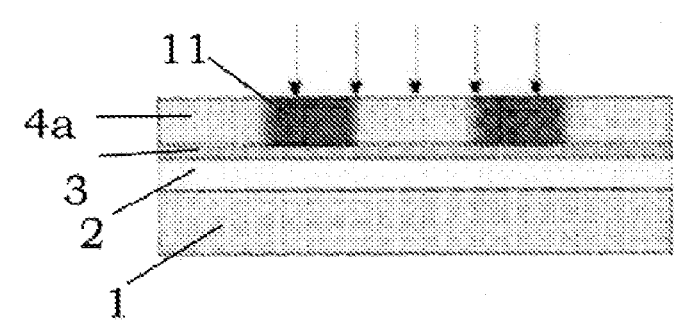
FIG. 1H
(Prior Art)
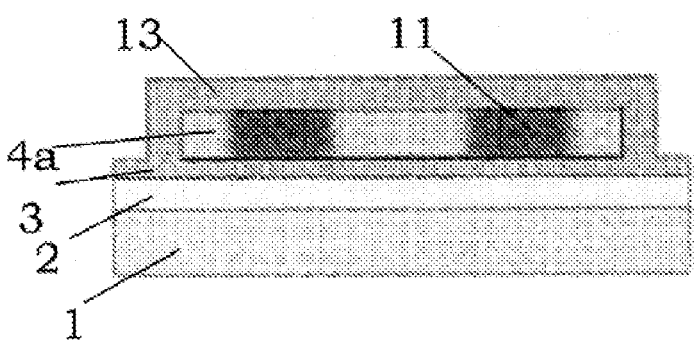
FIG. 1I
(Prior Art)

PROCESS FOR MANUFACTURING A TFT DEVICE WITH SOURCE AND DRAIN REGIONS HAVING GRADUAL DOPANT PROFILE

BACKGROUND

1. Technical Field

The present invention relates to a process for manufacturing a TFT (Thin Film Transistor) device realized with source and drain regions having gradual dopant profile and corresponding device.

The invention particularly, but not exclusively, relates to a TFT device of the non-self-aligned type and the following description is made with reference to this field of application by way of illustration only.

2. Description of the Related Art

As it is well known, in the last years polycrystalline silicon Thin Film Transistors (TFTs) have raised a great interest for their applications in large area microelectronics (LAM). They have taken an important role thanks to the possibility of combining a low realization cost with high performances. In fact, these TFT transistors show neatly higher performances with respect to the transistors realized with amorphous silicon in terms of mobility and stability.

Moreover, the introduction of a re-crystallization step through exposure to excimer laser (ELC, i.e., Excimer Laser Crystallization) in the manufacturing processes of these devices has allowed in fact to considerably improve the quality of the polysilicon layer they are made of, both increasing the grains sizes and reducing the density of the defects at the edges and inside the grains themselves. The combination of more extended grains and low density of defects allows to realize TFT transistors with high mobility and field effect ($\mu_{fe}$) suitable for realizing AMLCD, i.e., Active Matrix Liquid Crystal Displays or AMOLED, i.e., Active Matrix Organic Light Emitting Displays) to be used in laptops and in latest generation cell phones (UMTS), using the TFT transistors not only as switches of the active matrix but also for realizing the integrated elements of the addressing and control circuitry for the rows and the columns of the matrix itself.

A first known process for realizing TFT comprising source-drain regions self-aligned to the gate electrode provides the formation on a glass substrate of an amorphous silicon layer, which is followed by a crystallization step through laser for transforming the amorphous silicon layer into a polycrystalline silicon layer. On this latter layer the gate dielectric is deposited, and then the gate electrode is formed, which serves as mask for the successive dopant ionic implantation step which realizes the source-drain regions inside the polysilicon layer.

The process then requires a further annealing passage (either laser or thermal) for the removal of the defects induced by the implantation step and the dopant activation.

Since these devices are realized on glass substrates, the implantation step is not followed by a conventional diffusion step of the dopant atoms for realizing source-drain regions diffused towards the device channel (under the gate electrode) and thus these source-drain regions have a very high concentration gradient ("abrupt" junction type) originating high electric fields during the operation of the TFT device. In fact, the diffusion step of the dopant atoms implies a thermal step at high temperature which would deteriorate the glass substrate.

Although advantageous under several aspects, these TFT transistors which are formed with known "abrupt" junctions show problems linked to the high biasing voltages of the "drain" region which reduce the electric performances of the TFT transistors, such as for example the anomalous increase of the output current, also called "kink" effect, besides the degradation of the electric characteristic linked to the presence of hot carriers and to an increase of the turn-off current of the TFT transistor known as "leakage" current.

In fact, the electric field associated with the biasing voltage of the "drain" region is in turn sensitive to the dopant profile of the "drain" region next to the channel region, in particular when the dopant profile of the "drain" region, next to the channel region, has a very high concentration gradient ("abrupt" junction type).

Therefore this first known process leads to the formation of source and drain regions with high concentration gradient dopant profile and, as per what has been mentioned above, under biasing conditions of the "drain" region, imply an increase of the electric field in the channel regions with subsequent electric deterioration of the TFT transistor performances.

A second known process for realizing TFT comprising source-drain regions non-self-aligned to the gate electrode provides the formation on a glass substrate of an amorphous silicon layer which is followed by a dopant ionic implantation step for realizing the source-drain regions inside the amorphous silicon layer. A crystallization step through laser is then carried out, which activates the implanted dopant and further causes the diffusion of the dopant atoms towards the channel region comprised between the source/drain regions, with a diffusion length which depends on the number of laser pulses applied.

Due to the photolithographic tolerances, the overlapping between the gate electrode and the source-drain regions cannot be lower than about 2 µm, resulting in parasitic capacitances.

It is also known that the source/drain regions of the non-self-aligned TFT can be realized with doped silicon layers deposited through PECVD on an amorphous silicon layer, as described in the article "Thin Film Transistors Fabricated by In Situ Doped Unhydrogenated Polysilicon Films Obtained by Solid Phase Crystallization" by L Pichon, K Mourgues, F Raoult, T Mohammed-Brahim, K Kis-Sion, D Briand and O Bonnaud published on Semicond. Sci. Technol. 16 (2001) 918-924.

In this latter process, the doped layer on the channel is removed prior to the silicon crystallization step. This removal step is realized through a plasma etching of CF4+O2 (RIE) which realizes regions with vertical side walls as shown in FIG. 4. This removal process is not selective between the doped silicon layer and the underlying amorphous silicon layer, thus the etching time should be exactly calculated. Moreover, the plasma used for the etching can generate defects in the etched region, which is the active portion of the channel.

A further process for the manufacturing of the TFT transistors with gradual junctions, called lift-off, is described in the article "A Novel Fabrication Process For Polysilicon Thin film Transistors With Source/Drain Contacts Formed by Deposition and Lift-Off Of Heavily Doped Layers" by G. Fortunato et al, published on "Solid State Electronics", vol. 46 (2002) 1351-1358, and shown with reference to FIGS. 1A-1O.

In particular, on a glass substrate 1a silicon nitride layer 2, a first silicon oxide layer 3, an hydrogenated amorphous silicon layer 4 (a-Si:H), a second silicon layer 5 and a photo-lithographic mask 6 provided with first openings 7 of a first width are formed in cascade.

As shown in FIG. 1C, the second oxide layer 5 is selectively removed through the first openings 7 to form second openings 8, in this second oxide layer 5, of greater width than the first openings 7.

A first strongly doped polysilicon layer 9 is then formed on the photo-lithographic mask 6 and a second strongly doped polysilicon layer 11 on the hydrogenated amorphous silicon layer 4 inside the second openings 8.

In particular, the second polysilicon layer 11 is not in direct contact with the walls of the second openings 8 and forms the source and drain regions of the TFT transistor 10, which will be hereafter indicated with the same reference number 11. As shown in FIG. 1D, a gap region is then formed between the second oxide layer 5 and the source/drain regions 11.

The process then goes on with the removal of the photo-lithographic mask 6 and of the first polysilicon layer 9 (lift-off) as shown in FIG. 1E.

Also the second oxide layer 5 is then removed, as shown in FIG. 1F.

The presence of the gap region facilitates the removal step of the second oxide layer 5.

As shown in FIG. 1G, the process goes on with a de-hydrogenation step which is followed by a re-crystallization step through exposure to an excimer laser beam (ELC, i.e., Excimer Laser Crystallization).

At the end of this step the hydrogenated amorphous silicon layer 4 has been transformed into a polycrystalline silicon layer 4a wherein the source/drain regions 11 are integrated as shown in FIG. 1H.

A second photolithographic step is then carried out for removing the silicon layer which is outside the source/drain regions 11 and the device channel so as to delimit the active area of the TFT transistor 10. A third oxide layer 13 is then formed on the whole exposed surface, as shown in FIG. 1I.

By means of a third photolithographic step which makes use of a further photolithographic mask 14 provided with third openings 15 aligned to the source/drain regions 11, the third oxide layer 13 is removed until the polysilicon layer 4a is exposed, for opening contact vias 16, as shown in FIG. 1L.

Once a metallic layer 17 is formed on the whole device, as shown in FIG. 1M by means of a fourth photolithographic step which makes use of a further photolithographic mask provided with fourth openings 19 aligned to the third openings 15 with smaller width, the metallic layer 17 is removed through the fourth openings 19, to form the contacts $C_T$ of the TFT transistor 10, as shown in FIGS. 1N and 1O.

This lift-off process of the source/drain regions 11 could be realized without needing the presence of the second oxide layer 5, however, the lift-off step of the source/drain regions 11 from the resist mask 6 does not ensure a neat definition between the active regions and the regions to be removed after the lift-off process itself. The process therefore shows a certain criticality and to overcome this problem the second silicon oxide layer 5 has been exactly introduced immediately below the resist mask 6. In this way in fact, by subjecting the second oxide layer 5 to a selective and prolonged etching, shown in FIG. 1C, it is possible to succeed in removing it far below the edge of the resist mask 6 thus creating a discontinuity that makes the lift-off process easier.

However, although this measure removes the criticality of the feasibility of the source/drain regions 11 due to the removal of the oxide layer 5 which has the function of hard-mask after the lift-off process has occurred, it introduces another one which, even if not critical from a feasibility viewpoint, is instead critical from an industrial viewpoint since it is linked to the reproducibility of the openings 8.

In fact, the etching step of the oxide layer 5, after the photolithographic step, necessarily occurs though wet process and below the resist mask 6. The control of the lateral width of the openings 8 is critical and thus the width and the lateral profile of the source/drain regions 11 are not repeatable.

In fact, the lateral profile of the polysilicon layer 11 which is grown inside the openings 8 strictly depends on the width of the openings 8 below the mask 6 that, as already said, is not controllable and repeatable.

The poor controllability on the oxide layer 5 which is laterally etched, besides on the variation of the channel length, has then negative effect also on the shape of the dopant profile of the source/drain regions after the crystallization step.

In fact, this crystallization step, necessary for activating and diffusing the dopant of the polysilicon layer 11 in the polysilicon layer 4a, provides again in the polysilicon layer 4a a similar dopant profile which preserves the memory of the previous process originating source and drain regions 11 with dopant profile also being not enough repetitive from an industrial point of view, more or less of the "abrupt" type, depending on how the process tolerances associated with the photolithographic step are combined with the photolithographic step, etching step as well as with the greater or minor selectivity of the lift-off process in general associated with the resist/residual deposited material removal and residual oxide removal steps and this causes electric performances of the device with wide excursion of the control parameters.

Therefore, the lift-off process implies an intrinsic poor reproducibility of the structure of the active region of the transistor 10 which in turn implies a wide dispersion of the electric parameters, to the disadvantage of a low product performance which make the process little attractive on an industrial scale.

BRIEF SUMMARY

One embodiment is a process for realizing a TFT device without doped regions obtained by means of ionic implantation and with source and drain regions having a controlled dopant profile and able to maintain low electric field values next to the channel region overcoming the limits and/or drawbacks still limiting the devices realized according to the prior art.

One embodiment forms a doped amorphous silicon layer on an intrinsic amorphous silicon layer, followed by selective removal of the doped layer with respect to the underlying intrinsic amorphous layer.

Advantageously, the etching step of the doped amorphous silicon layer is realized so as to obtain portions of the doped amorphous silicon layer with a controllable gradual profile, which is reflected, after a diffusion and activation step, into a similar gradual profile of the source and drain regions of a TFT transistor.

One embodiment is a process for realizing TFT devices on a substrate comprising the steps of:
  forming on the substrate, in cascade, an amorphous silicon layer and a heavily doped amorphous silicon layer,
  forming a photolithographic mask on the heavily doped amorphous silicon layer provided with an opening,
  removing the heavily doped amorphous silicon layer through the opening for realizing opposite portions of the heavily doped amorphous silicon layer whose cross dimensions decrease as long as they depart from the amorphous silicon layer,
  removing the photolithographic mask, carrying out a diffusion and activation step of the dopant contained in the portions of the heavily doped amorphous silicon layer into said amorphous silicon layer, for realizing source/drain regions of said TFT device.

One embodiment is a process for defining a heavily doped amorphous silicon layer formed on a substrate. The process includes:

forming the heavily doped amorphous silicon layer by means of a low temperature process, selectively removing said heavily doped amorphous silicon layer by means of a development solution of photolithographic materials, the substrate being formed by a material that cannot be etched by the development solution of photolithographic materials.

The characteristics and the advantages of the invention will be apparent from the following description of an embodiment thereof given by way of indicative and non-limiting example with reference to the annexed drawings.

DETAILED DESCRIPTION

With reference to FIGS. 2 to 10, a process is described for realizing a TFT device 20 with source and drain regions with gradual dopant profile.

The Figures showing cross-sections of portions of an integrated circuit during the manufacturing are not drawn to scale but are instead drawn so as to show important features.

The process can be put into practice together with the manufacturing techniques of the integrated circuits currently used in the field, and only those process steps being helpful for the comprehension of the process are included.

Figure 1A:
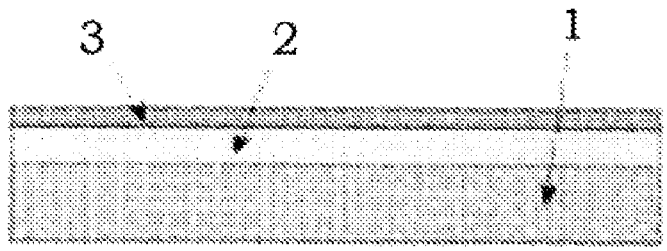
FIGS. 1A to 1O respectively show schematic vertical section views of the TFT transistor during some manufacturing steps of a known process, FIGS. 2 to 10 respectively show schematic vertical section views of the TFT transistor during some manufacturing steps of the process according to one embodiment.
Figure 1B:
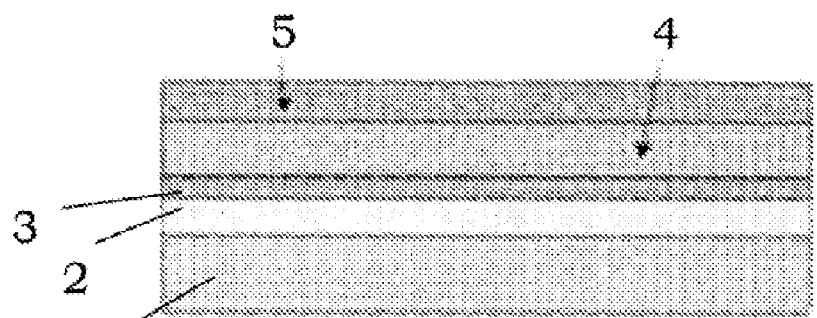
Figure 1C:
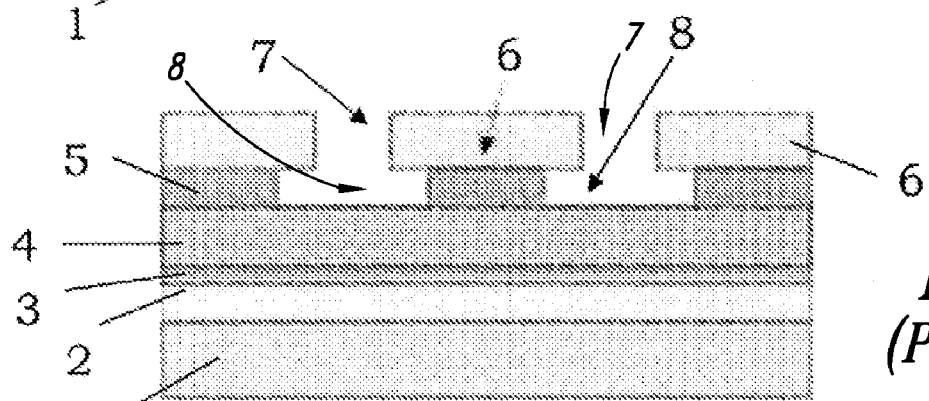
Figure 1D:
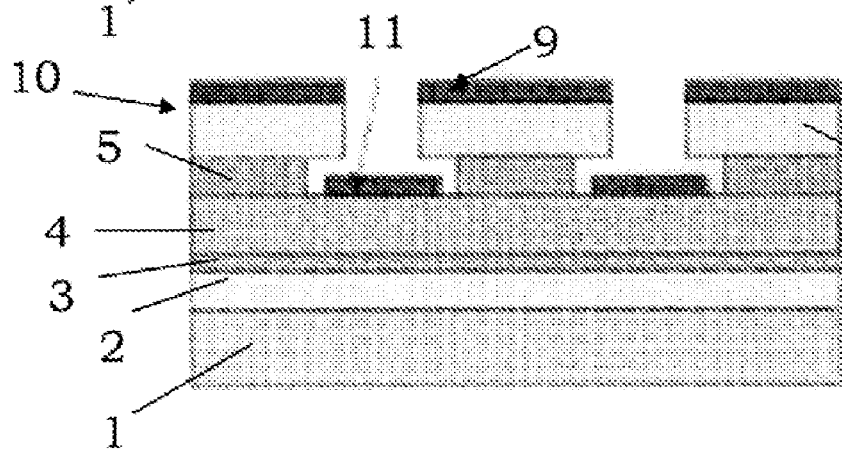
Figure 1L:
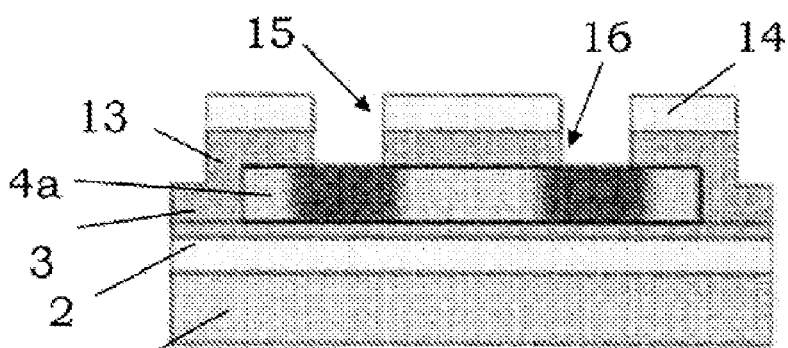
Figure 1M:
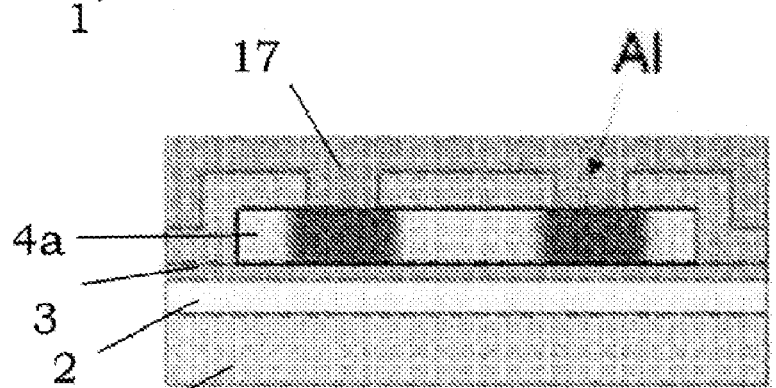
Figure 1N:
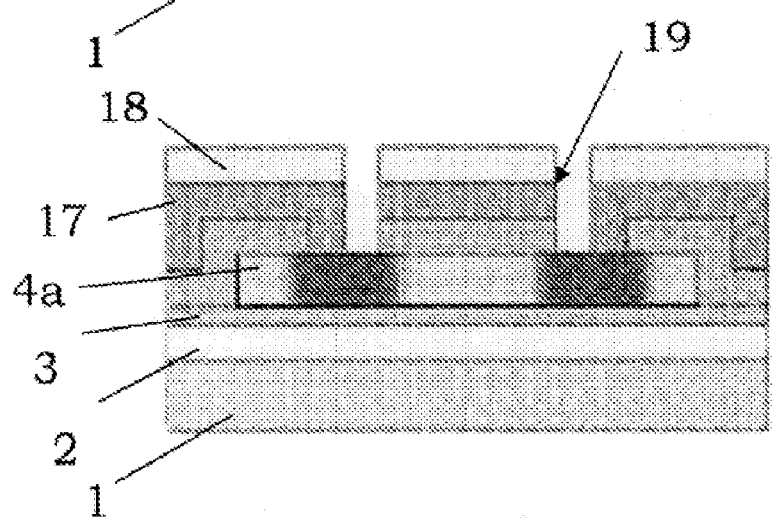
Figure 1O:
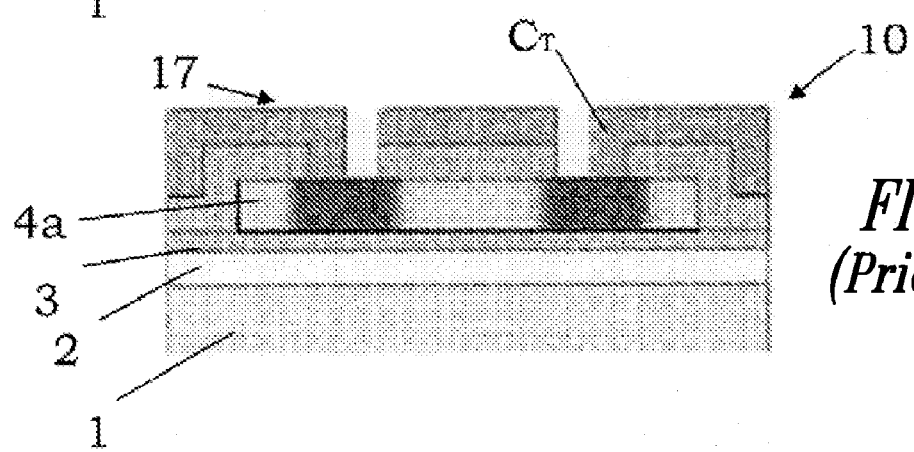
Figure 2:
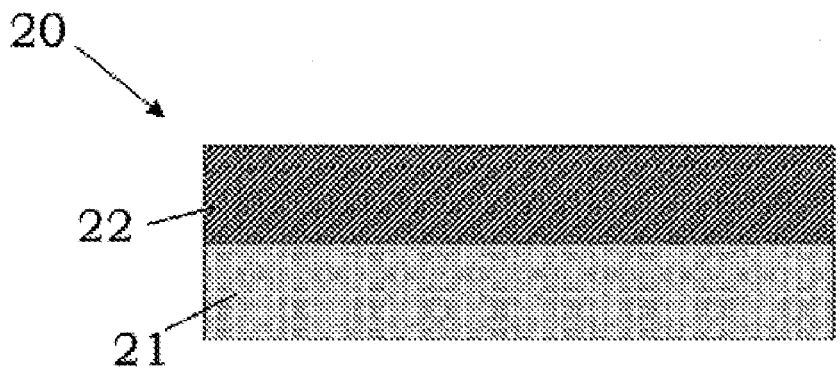

With reference to FIG. 2, on a substrate 21, for example a glass or plastic substrate, advantageously, at least a first insulating layer 22 is formed, for example of silicon oxide.

Figure 3:
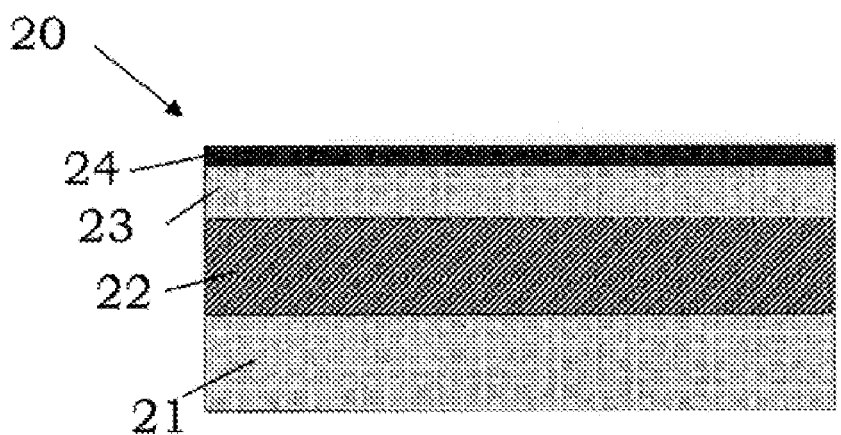

On the first oxide layer 22 an amorphous silicon layer 23 of thickness comprised between 20-200 nm and a heavily doped amorphous silicon layer 24 for example of the $n^+$ type of thickness comprised between 5-30 nm are formed in cascade for realizing nTFT devices, as shown in FIG. 3.

For realizing pTFT devices, a heavily doped amorphous silicon layer 24 of the $p^+$ type is instead formed.

Advantageously, the intrinsic amorphous silicon layer 23 is deposited through PECVD (Plasma Enhanced Chemical Vapor Deposition) at high temperature, i.e., higher or equal to 150° C. or LPCVD (Low Pressure Chemical Vapor Deposition) which, in a known way, is carried out at temperatures higher than 400° C.

Advantageously, the heavily doped amorphous silicon layer 24 is formed through PECVD by depositing the layer 24 at a low temperature of the substrate, i.e., lower or equal to ≦120° C.

On the heavily doped amorphous silicon layer 24 a first photolithographic mask 25 provided with a first opening 26 is formed.

Figure 4:
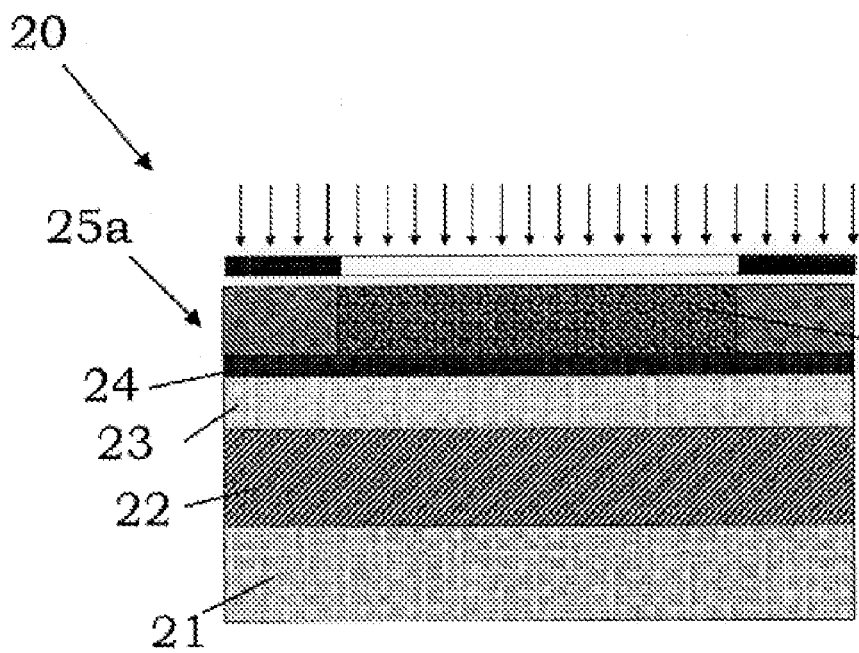
Figure 5:
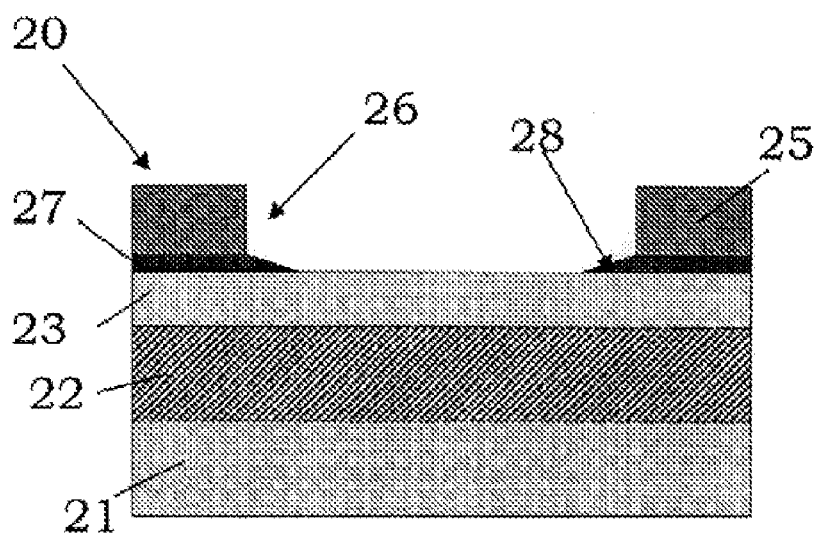

Advantageously, this first mask 25 is obtained by forming a layer 25a of photolithographic material, for example photoresist, on the heavily doped amorphous silicon layer 24 which is selectively exposed to a luminous source in correspondence with the opening 26, as shown in FIG. 4.

Portions 25b of the layer 25a of photolithographic material exposed to the luminous source are then removed.

For example, the removal step of the exposed portions 25b occurs by using a solution, called photoresist development, containing, for example, NaOH.

The heavily doped amorphous silicon layer 24 is then selectively removed through this first opening 26 until the amorphous silicon layer 23 is exposed, for realizing portions 27 of the heavily doped amorphous silicon layer 24.

Advantageously, if the amorphous silicon layer 23 and the heavily doped amorphous silicon layer 24 are formed with different temperatures, the solution of photoresist development, after having removed the exposed portions 25b, also removes the heavily doped amorphous silicon layer 24 exposed through this first opening 26.

This solution of photoresist development does not instead etch the amorphous layer 23 deposited at a higher temperature.

In particular, in this embodiment, the development step of the photoresist by means of the use of the solution of photoresist development, is longer with respect to the conventional realization steps of a photolithographic mask.

The etching step of the heavily doped amorphous silicon layer 24 through this first opening 26, forms, in this layer, a second opening 28 whose side walls are tapered, i.e., the cross dimensions from the second opening 26 increase as long as they depart from the amorphous silicon layer 23.

Figure 6:
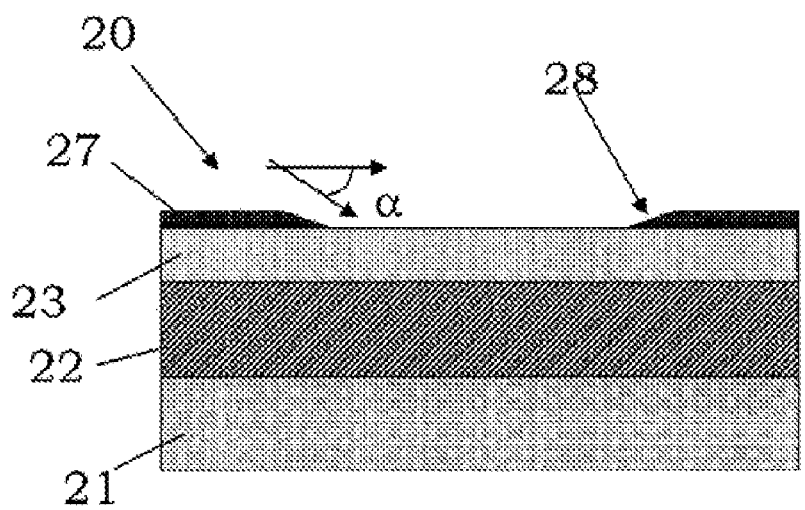

In other words, on this amorphous silicon layer 23, opposite portions 27 of the heavily doped amorphous silicon layer 24 are defined whose cross dimensions decrease as long as they depart from the amorphous silicon layer 23, as shown in FIG. 6.

The opposite portions 27 of the heavily doped amorphous silicon layer 24 delimit a channel region of the transistor 20 inside the amorphous silicon layer 23.

In particular, the portions 27 of the heavily doped amorphous silicon layer 24 have a vertical section in a substantially trapezoidal shape, wherein the oblique side is adjacent to the channel region.

Tests carried out by the applicant have proved that, if heavily doped amorphous silicon layers 24 are used, i.e., having a dopant concentration higher than or equal to $10^{19}$ at/cm$^3$, for example obtained by using a solution at 1% of PH$_3$ during the deposition step in the case of n$^+$ dopant or at 1% of B$_2$H$_6$ in the case of the p$^+$ type, deposited at low temperature i.e., for temperatures lower than 120° C., these heavily doped amorphous silicon layers 24 are efficiently removed together with the exposed portions 25b of the layer 25a of photolithographic material, with an average etching speed of about 9.2 nm/min.

In fact, as already highlighted, the solution of photoresist development etches the exposed portions 25b of the layer 25a of photolithographic material and the heavily doped amorphous silicon layer 24 deposited at low temperature, instead it does not etch the amorphous layer 23 deposited at higher temperature.

Figure 11:
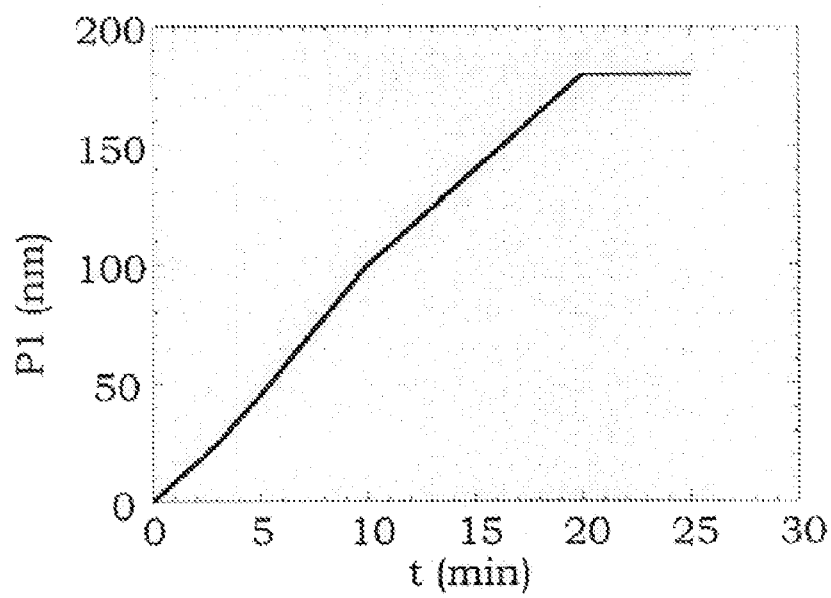

In particular, FIG. 11 shows the thickness P1 of the heavily doped amorphous silicon layer 24 of the n$^+$ type which is removed from the solution of photoresist development when time varies.

Figure 12:
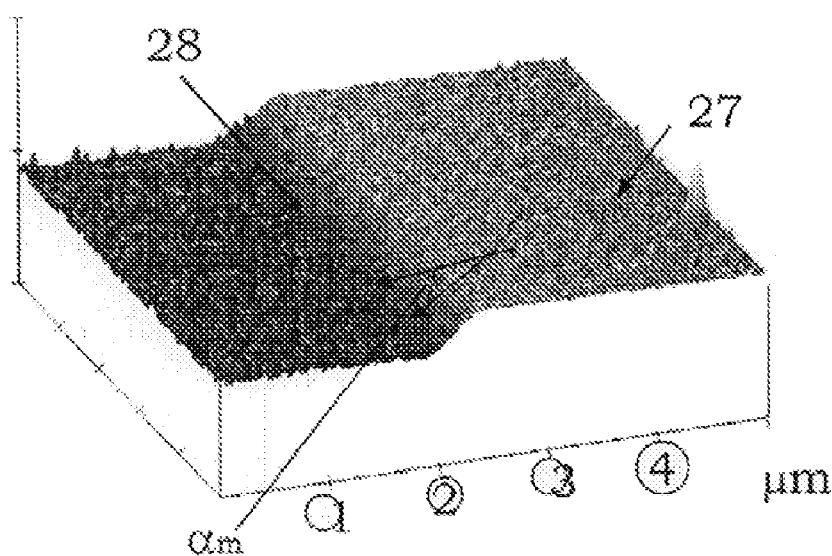
FIG. 12 shows an AFM image of the edge area of the layer of FIG. 7a after the process step shown in FIG. 6.

Through AFM (Atomic Force Microscopy) measures it is also possible to analyze the profile of the portions 27 of the heavily doped amorphous silicon layer 24 next to the channel region, as shown in FIG. 12.

As it can be noted, in this embodiment of the invention, the lateral profile of the portions 27 next to the channel region is gradual and forms an angle $\alpha_m$ measured very narrow of about 4° with the surface of the amorphous silicon layer 23, while the transition area between the heavily doped layer 24 removed and that one not removed is in the order of 0.5 μm.

Therefore, by using the solution of photoresist development to form the opposite portions 27, it is possible to obtain an inclination of the oblique side of these portions 27 being much more gradual than what is possible to obtain with the conventional plasma etching steps. Therefore, it is possible to obtain a side profile of the portions 27 next to the channel region which is gradual and forms an angle α smaller than 45° preferably smaller than 10°.

In particular, the lateral profile, so gradual, of the portions 27 is due to the different removal speed of the photoresist the mask 25 is formed of and of the heavily doped amorphous silicon layer 24. In fact, being the lateral removal speed of the photoresist about 9 times that of the doped amorphous silicon layer 24, during the etching step of this layer 24 also the side walls of the opening 26 of the mask 25 are progressively removed and then go back with respect to the initial edge of the mask 25, progressively uncovering a greater surface of the heavily doped amorphous silicon layer 24.

Figure 13:
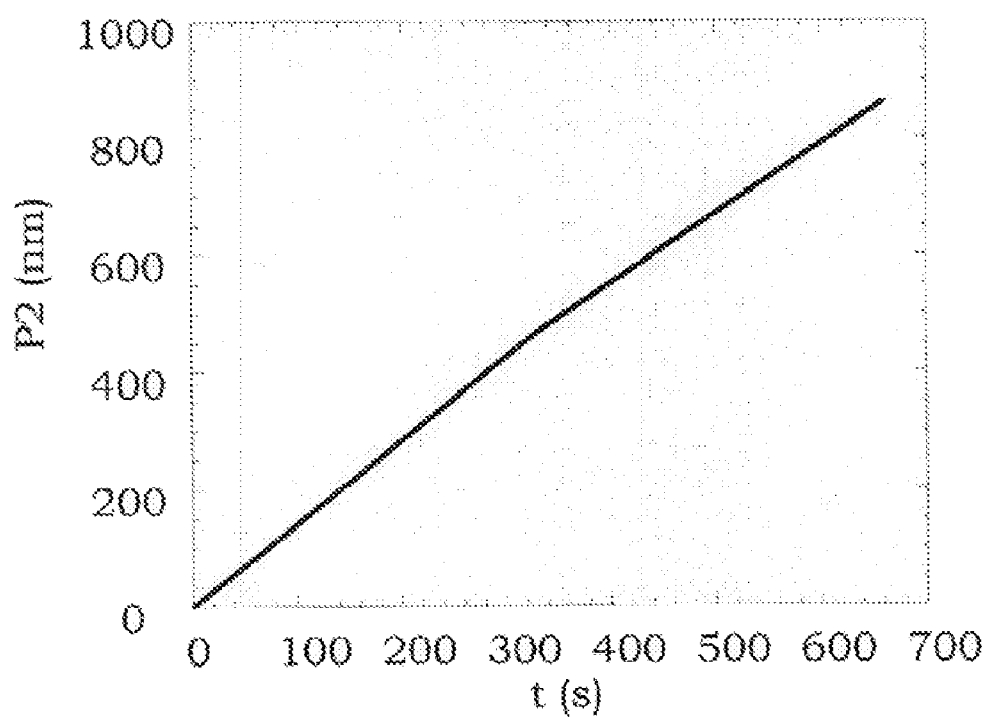
FIG. 13 shows the amount of photoresist which is removed during the process step shown in FIG. 5.

In particular, FIG. 13 shows the thickness P2 of the photoresist of the mask 25 which is removed when time varies with an etch-rate equal to 80 nm/min.

Moreover, calculations carried out by the applicant, taking into account the etching speeds of the photoresist the mask 25 is made of and of the heavily doped amorphous silicon layer 24, have shown that the lateral profile of the portions 27 forms an angle α of about 6° with the surface of the amorphous silicon surface 23, as shown in FIG. 6, in good accordance with the experimental measures taken through AFM, shown in FIG. 12.

Therefore the gradual profile of the portions 27 is directly connected to the removal in the two directions of the photoresist layer 25a and of the heavily doped amorphous silicon layer 24, i.e., in the orthogonal direction and in the parallel direction to the surface of the amorphous silicon layer 23.

Advantageously, this lateral oblique profile of the portions 27 can be controlled through the variation of the removal speeds of the selectively exposed layer 25a of photolithographic material and of the heavily doped amorphous silicon layer 24.

As already highlighted, the selectivity of the removal process of the exposed portions 25b and of the doped silicon layer 24 with respect to the intrinsic layer 23 is instead extremely high ($R_n$+/$R_{a\text{-}Si}$>8000) the layers 23 and 24 being formed at very different temperatures. In particular, for etching times up to 90 min by means of the solution of photoresist development it has not been possible to measure, through AFM, remarkable reductions (<1 nm which is the sensitivity of the measure AFM) of the thickness of these amorphous silicon layers 23 deposited through PECVD at high temperature or LPCVD.

This gives the possibility to develop the photoresist layer 25a and at the same time to remove the doped n$^+$ layer 24 above the channel without etching the underlying amorphous silicon layer 23.

The process at this point goes on with the conventional manufacturing steps, providing a step of diffusion and activation of the dopant contained in the portions 27 of the heavily doped amorphous silicon layer 24 into the amorphous silicon layer 23.

Advantageously, this diffusion and activation step also comprises a crystallization step.

For example the diffusion and activation step occurs through exposure to an excimer laser beam of the portions 27 of the heavily doped amorphous silicon layer 24 and of the amorphous silicon layer 23.

Figure 7:
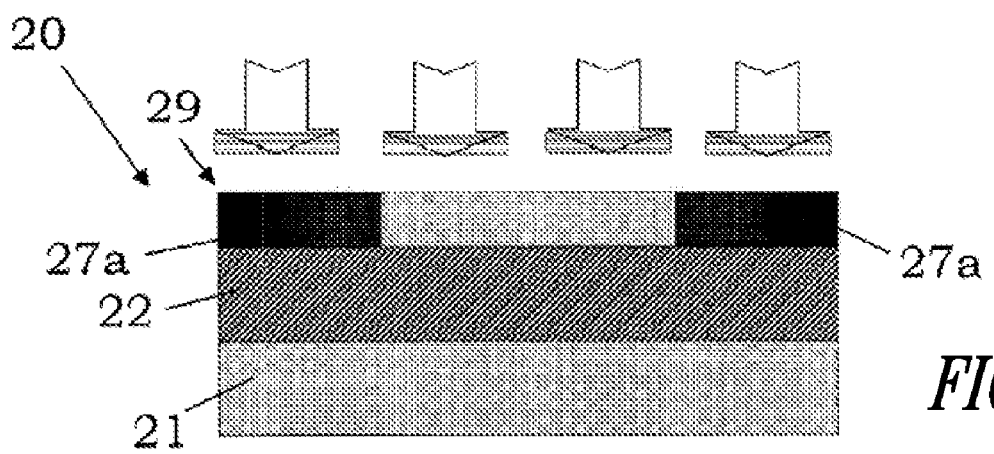
FIG. 7 shows a dopant profile of source/drain regions integrated in the layer shown in FIG. 7a, FIG. 11 is a diagram showing the amount of heavily doped amorphous silicon layer which is removed during the process step shown in FIG. 6.

At the end of this step the hydrogenated amorphous silicon layer 23 has been transformed into a polycrystalline silicon layer 29 wherein source/drain regions 27a are integrated as shown in FIG. 7.

Figure 7A:
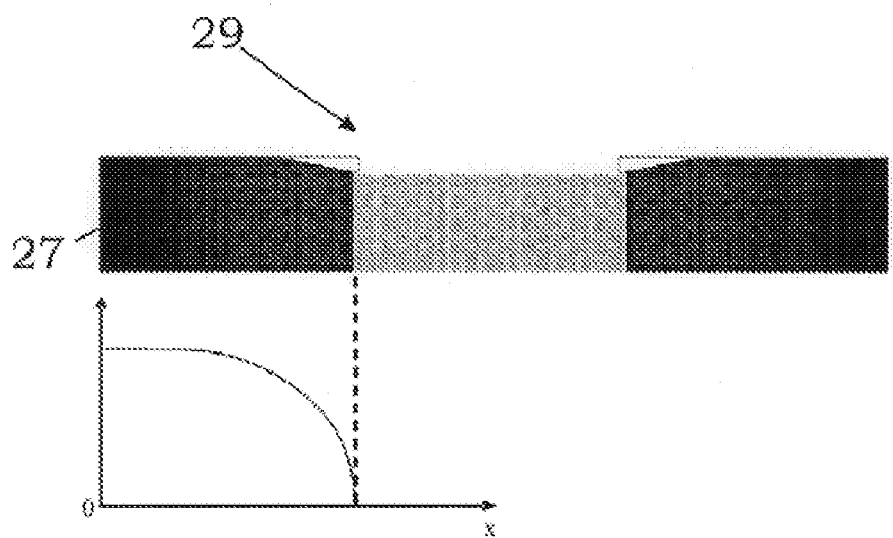
FIG. 7a shows a view of a layer of the TFT device after the process step shown in FIG. 7.

Therefore, the etching step of the doped amorphous silicon layer 24 is realized so as to create a controllable gradual profile of the portions 27 not removed, as shown in FIG. 6, which is reflected, after the activation and diffusion step, in a similar gradual profile at the source and drain regions 27a inside the polycrystalline silicon layer 29 as shown in FIGS. 7a and 7b.

In particular, after the activation and diffusion step, the upper surface 29a of the polycrystalline silicon layer 29 is not completely planar, as shown in FIG. 7a. However, only by way of illustration, in FIGS. 7, 8, 9, and 10 the upper surface 29a is shown planar.

On the polycrystalline silicon layer 29 an insulating layer 30, for example of gate oxide, is then formed.

Figure 8:
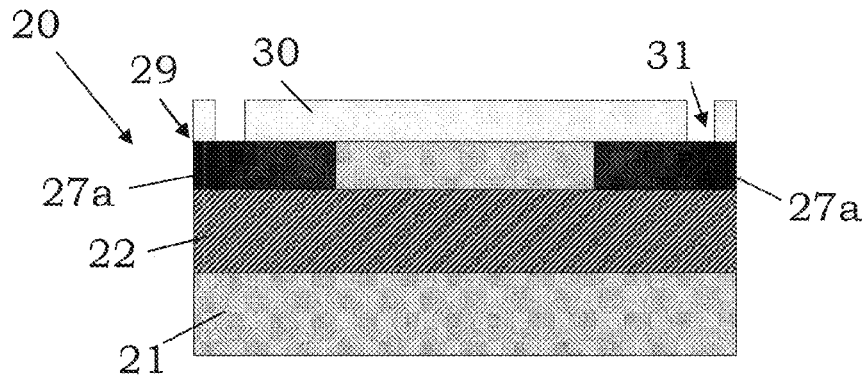

By means of a photolithographic step using a further photo-lithographic mask provided with openings overlapped and aligned to the source/drain regions 27a, the gate oxide layer 30 is removed to expose the polycrystalline silicon layer 29, for opening contact vias 31, as shown in FIG. 8.

Figure 9:
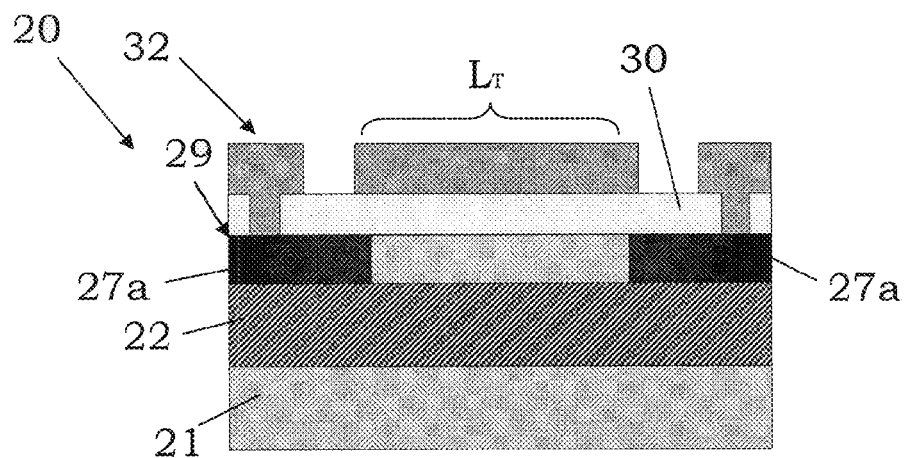
Figure 10:
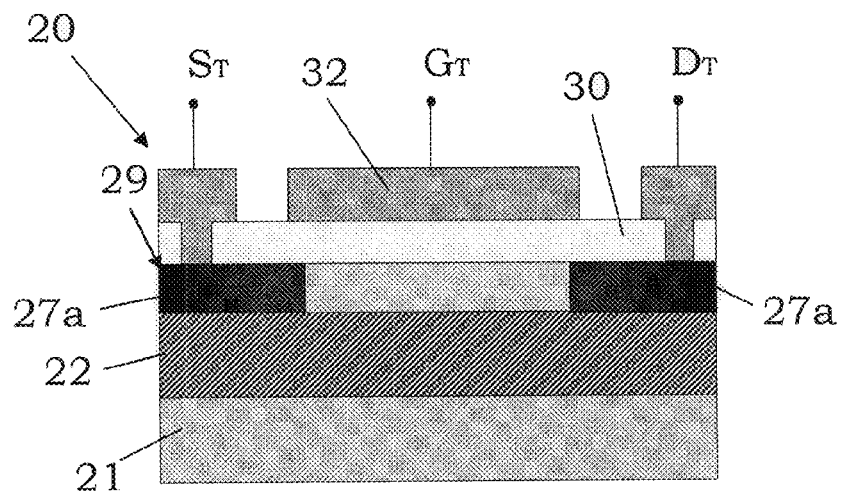

Once a conductive layer 32 has been formed, for example of metal, on the whole device, by means of a further photolithographic step using another photolithographic mask provided with further openings aligned to the source/drain regions 27a but not to the contact vias 31, the conductive layer 32 is removed through the further openings, to define the gate electrode $G_T$ of length $L_T$ and the contacts $S_T$ and $D_T$ of the TFT transistor 20, as shown in FIGS. 9 and 10.

The manufacturing process of gradual selective removal of the doped layer 24 represents a great simplification of the manufacturing process of the TFTs, as reported in the article by G. Fortunato et al, published on "Solid State Electronics", vol. 46 (2002) 1351-1358, which, as already highlighted, shows reproducibility problems compared to the process of FIGS. 2-10.

Moreover, the process allows to define doping gradual profiles of the source/drain regions 27a, so as to obtain improved output electric characteristics of the TFT devices.

The nTFT device obtained with the process of FIGS. 2-10 does not explicitly show the definition step of the active area, this step after the realization of the source and drain regions being completely conventional.

It is also to be observed that an alternative embodiment, wherein the amorphous silicon layer 23 and the heavily doped amorphous silicon layer 24 are formed at different temperatures, is particularly simplified with respect to the lift-off process reported in the prior art, with the advantage of a greater versatility and industrial performance. In this process sequence according to the invention in fact the definition of the portions 27 occurs through conventional photomasking processes and in a single step, i.e., the development of the photoresist layer 25a which forms the mask 25 automatically implies also the removal of the doped layer 24 of the n+ type from the non-desired regions, in a simple and controlled way, without requiring the definition of additional hardmask layers which, like in the case of the lift-off process, would make the sequence more complicated, not versatile and even more expensive.

Figure 14:
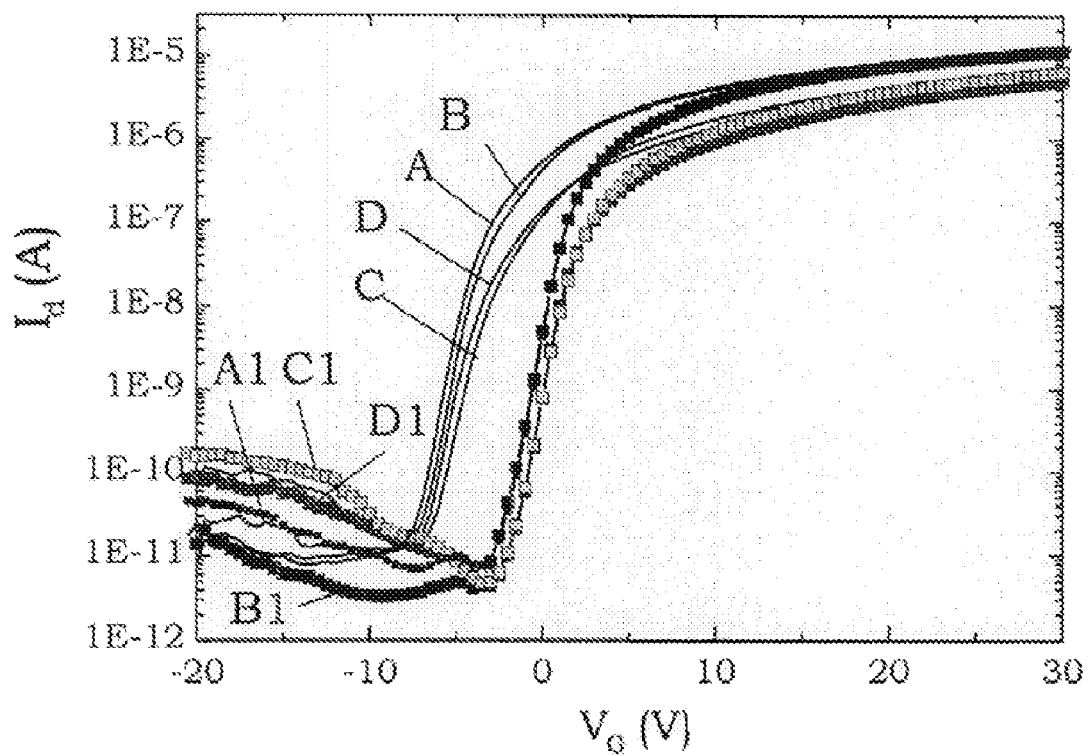
FIG. 14 shows some transfer characteristics of devices realized with the process of FIGS. 2-10, in semi-logarithmic scale.
Figure 15:
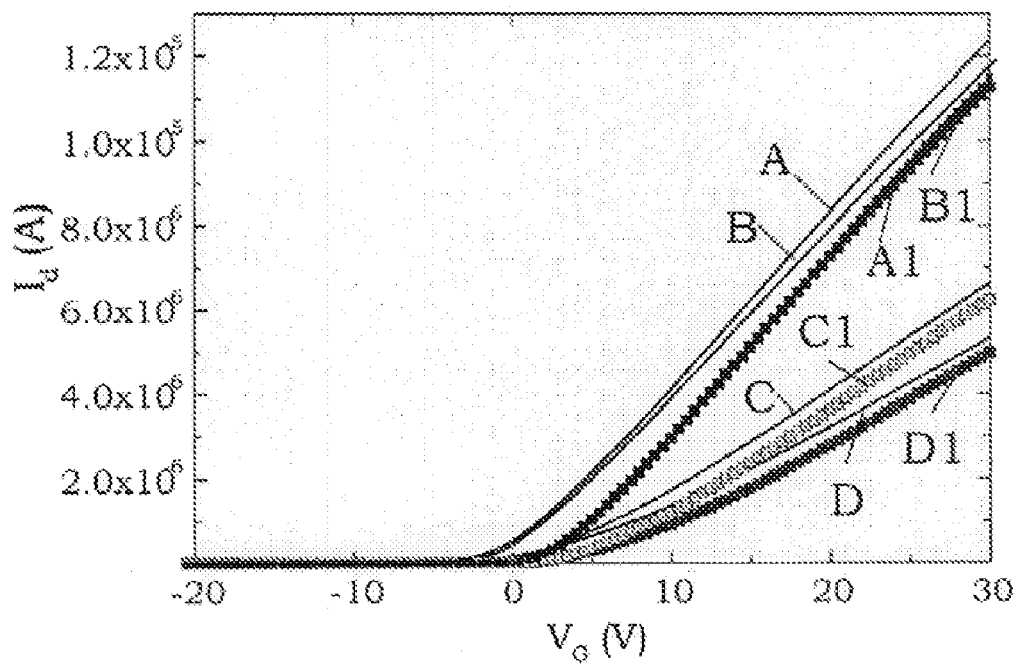
FIG. 15 shows some transfer characteristics of devices realized with the process of FIGS. 2-10, in linear scale.

The transfer characteristics of the devices 20 realized according to the invention having width and length $L_T$ of 20 μm are now analyzed. In particular, FIGS. 14 and 15 respectively show the transfer characteristics of the drain current $I_D$ as a function of the gate voltage $V_G$, for a drain-source voltage VDS equal to 0.1 volt, respectively in semi-logarithmic and linear scale, of the devices 20.

The measures have been taken in a voltage range $V_G$ comprised between −20-30V for considering both the turn-on (on) and turn-off (off) region of the transistor.

The drain voltage used is very low, equal to $V_{DS}$=0.1V so as to eliminate the phenomena induced by high electric fields such as the "leakage" current.

In particular, the curves A, B, C, and D refer to transistors 20 realized with a further final annealing step in Nitrogen for 30 minutes with a temperature of 350° C., which have been irradiated through excimer laser with decreasing energy $E_L$, respectively of 480, 470, 460 and 450 mJ/cm².

The curves A1, B1, C1, and D1 refer to transistors 20 realized with a further annealing final step in Nitrogen for 3 hours with a temperature of 350° C., which have been irradiated through excimer laser with decreasing energy $E_L$, respectively of 480, 470, 460 and 450 mJ/cm².

In particular, the transistors that have undergone an irradiation with $E_L$ equal to 480 mJ/cm² have a mobility μ equal to 205 cm²/Vs, those which have undergone an irradiation with $E_L$ equal to 470 mJ/cm² have a mobility μ equal to 198 cm²/Vs, those having undergone an irradiation with $E_L$ equal to 460 mJ/cm² have a mobility μ equal to 118 cm²/Vs, while those having undergone an irradiation with $E_L$ equal to 450 mJ/cm² have a mobility μ equal to 93 cm²/Vs.

As it is understood from these diagrams, the devices 20 show good electric performances: they are in fact characterized by a great ratio between the turn-on current $I_D$ (on) measured at $V_G$=30V and the turn-off current $I_D$ (off) measured at $V_G$=−20V, equal to about six decades in current, and by a good underthreshold slope in the order of 0.8-1V/decade.

Figure 16:
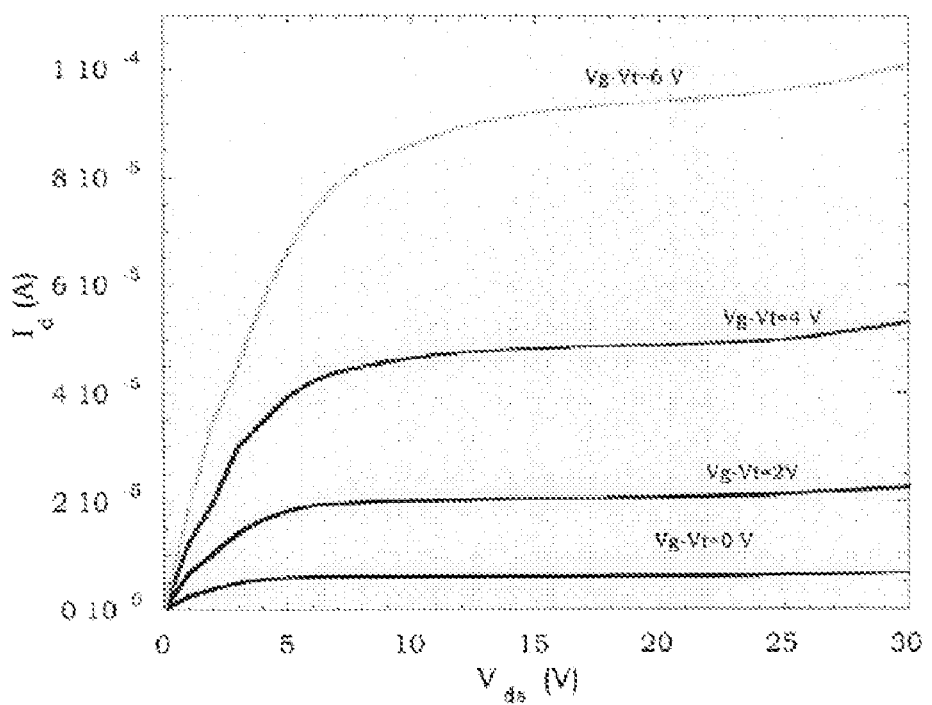
FIG. 16 shows some output characteristics of devices realized with the process of FIGS. 2-10, for different values of the voltage Vg–Vt.

However, the important characteristic of these devices 20 is shown by the output characteristics of drain current $I_D$ as a function of the voltage $V_{DS}$, which show a well defined and rather extended saturation region, before the intervention of effects induced by the impact ionization, as shown in FIG. 16.

In particular, the illustrated curves show how the output characteristics vary when the difference between gate voltage and threshold voltage (Vg–Vt) of a device 20 having a length $L_T$ equal to 20 μm varies.

It is in fact evident that the transistor 20 is maintained in a saturation condition up to voltages $V_{DS}$ in the order of 27V, and only for greater $V_{DS}$ a slight increase of the current is seen due to the "kink" effect, differently from what occurs in the known self-aligned transistors, where already at low $V_{DS}$ a remarkable increase of the current is present, like in those described in the article by G. Fortunato et al. "Comparative Analysis of Advanced Polysilicon Thin-Film Transistor Architectures for Drain Field Relief", *Proceedings Electronic Imaging '03 SPIE* vol. 5004, p. 150, 20-24 Jan. 2003, Santa Clara, Calif., USA.

The experimental evidence of these data confirms the efficiency of the gradual profiles of the source and drain regions 27a in minimizing the anomalous current increase at high biasing of the drain region. From the electric characteristics it is evident that these devices 20 can operate also at drain voltages greater than the saturation voltage ($V_D$>$V_{Dsat}$) and thus be efficiently used as "current drivers" in the displays using OLED (Organic Light Emitting Diode).

The gradual profile effect of the dopant of the source and drain regions 27a on the reduction of the kink effect present in the output characteristics is confirmed by the simulation of the electric characteristics of the transistor 20 according to the invention through for example the program of bidimensional number analysis DESSIS (Device Simulation for Smart Integrated Systems). In particular, the electric characteristics ($I_D$-$V_{DS}$) for a device 20 of the non self-aligned type with different dopant lateral distributions have been simulated.

Figure 17:
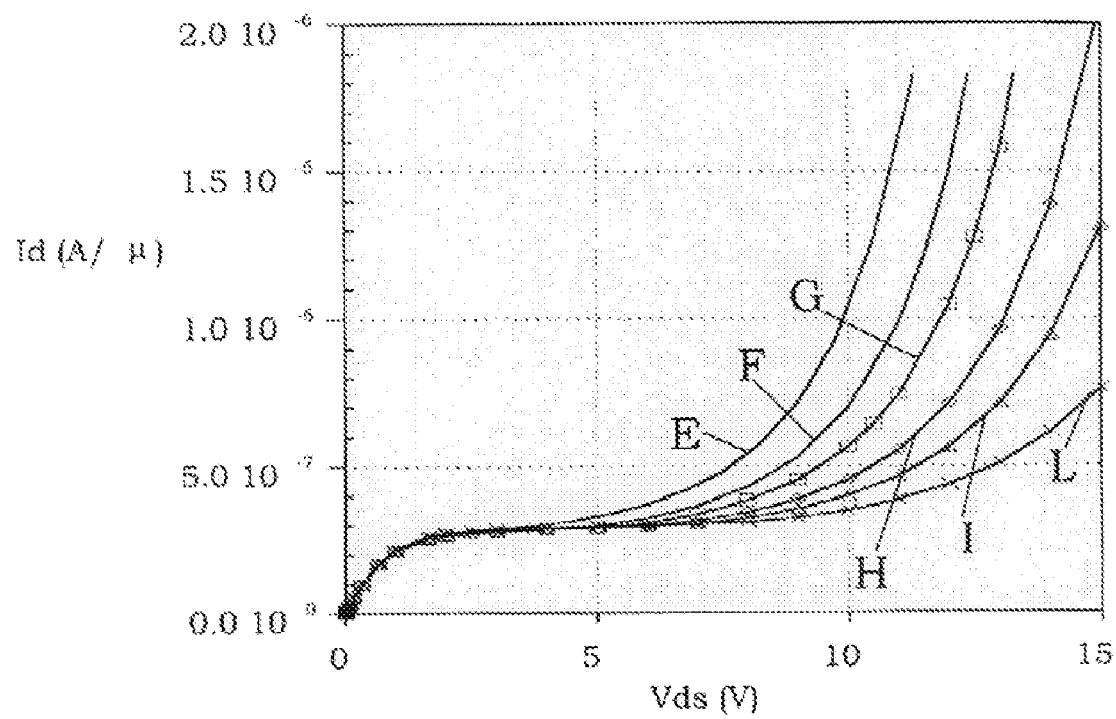
FIG. 17 shows some simulated output characteristics of TFT devices according to one embodiment with different values of dopant concentration gradient of the source/drain regions.

In particular, in FIG. 17, the curve E shows how the current $I_D$ varies according to the voltage when the source and drain regions 11 of the prior art have concentration lateral profiles with an "abrupt" distribution (self-aligned structure), the curves F, G, H, I and L show how the current $I_D$ varies according to the voltage $V_{DS}$ for a transistor 20 with a length $L_T$ equal to 6 μm, wherein the source and drain regions 27a have a lateral concentration profile with a lateral distribution of the Gaussian type with a value of the standard deviation (σ) respectively equal to 50, 100, 200, 300 and 500 nm.

Figure 18:
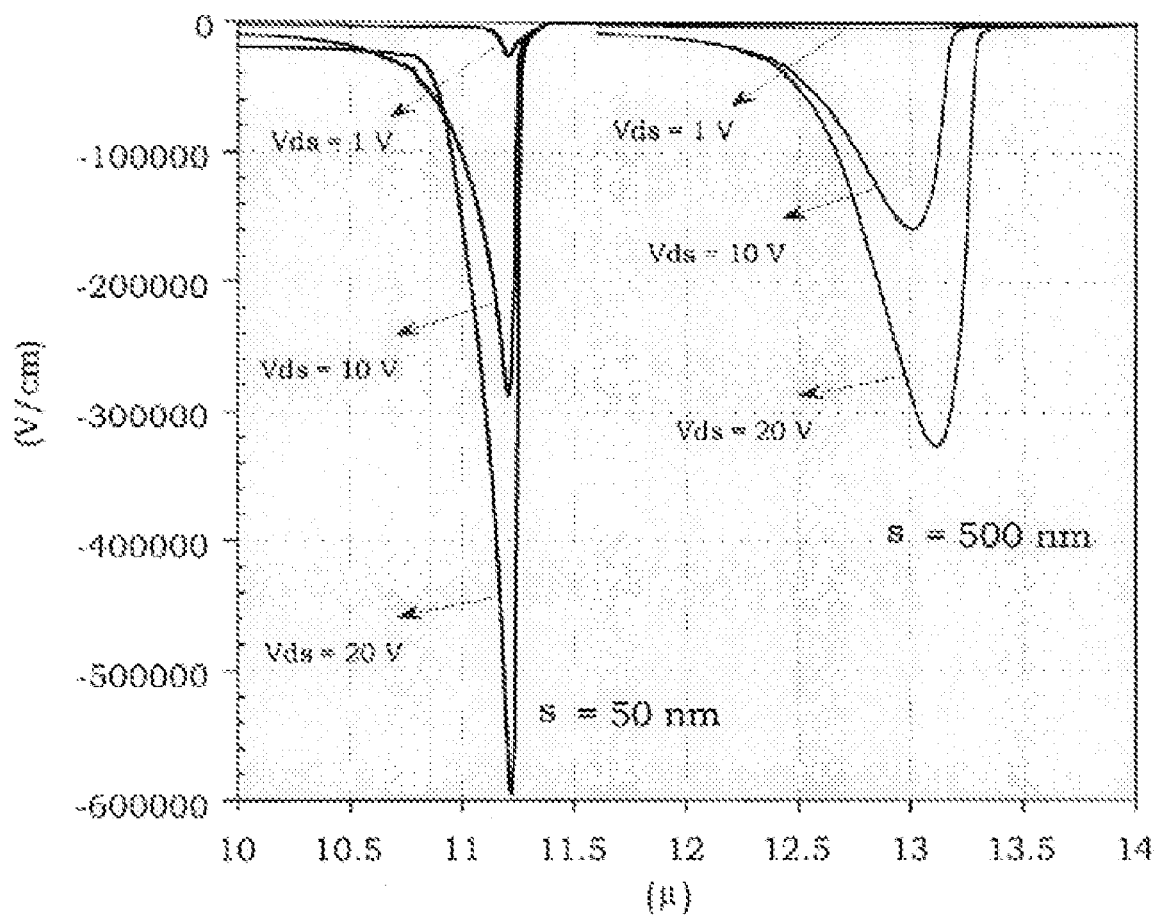
FIG. 18 shows how the longitudinal electric field in the drain region of devices realized with the process of FIGS. 2-10 varies for two different dopant concentration gradient values of the source/drain regions and different values of the voltage Vds.

As it can be noted from this latter Figure, the kink effect can be fairly reduced by the widening of the lateral profile of the doping of the S/D regions 27a, since the electric fields present at the drain region, and then the impact ionization effect, are reduced by this widening as shown in FIG. 18. The results of the simulations thus qualitatively explain what experimentally observed.

In conclusion, the manufacturing process allows to obtain source and drain regions able to ensure an optimum and controlled dopant profile, with high performances in terms of yield and thus also from an industrial viewpoint, with respect to the dopant deposition techniques used in the conventional processes, thanks to the simplicity and the repeatability of the process steps as used.

Moreover, the gradual doping latent profile obtained according to the invention remarkably reduces the electric fields at the drain/source-channel "junctions" thus remarkably reducing all the phenomena linked to the field, like the "kink" effect, the effect of the warm carriers and the "leakage" current.

Moreover, the process forms transistors with gradual junctions avoiding the use of ionic implantation steps which increase the costs of the manufacturing processes and uses a selective etching step for the removal of the doped amorphous silicon layer, produces a very gradual, lateral, substantially controllable profile of the doped regions before the activation step. This lateral profile results into a more gradual doping profile in the polysilicon layer 9 (the activation step being identical) with respect to the known non-aligned processes, both those providing a ionic implantation step and those providing the formation of deposited layers removed through RIE.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process, comprising:
   forming an amorphous silicon layer and a heavily doped amorphous silicon layer in cascade on a substrate;
   forming a photolithographic mask, having an opening, on said heavily doped amorphous silicon layer;
   defining opposite portions of said heavily doped amorphous silicon layer, the defining including removing portions of said heavily doped amorphous silicon layer through said opening, the opposite portions having cross dimensions that decrease as long as the opposite portions depart from said amorphous silicon layer;
   removing the photolithographic mask; and
   realizing source/drain regions, the realizing including carrying out a diffusion and activation step of the dopant contained in said opposite portions of said heavily doped amorphous silicon layer into said amorphous silicon layer.

2. A process according to claim 1 wherein said diffusion and activation step comprises a crystallization step.

3. A process according to claim 1 wherein said diffusion and activation step includes exposing the opposite portions to an excimer laser beam.

4. A process according to claim 1 wherein forming said heavily doped amorphous silicon layer includes depositing said amorphous silicon layer by PECVD with a temperature lower than or equal to 120° C.

5. A process according to claim 1 wherein forming said amorphous silicon layer includes depositing said amorphous silicon layer by PECVD with a temperature higher or equal to 150° C.

6. A process according to claim 5, wherein forming the photolithographic mask comprises:
   forming a layer of photolithographic material on said heavily doped amorphous silicon layer;
   selectively exposing portions of said layer of photolithographic material to a luminous source, said portions being aligned with said opening; and
   removing said portions of said layer of photolithographic material using a photoresist development solution, wherein said photoresist development solution also realizes said opposite portions by removing the portions of said heavily doped amorphous silicon layer for realizing said opposite portions.

7. A process according to claim 6 wherein during removing the portions of said heavily doped amorphous silicon layer, a surface portion of the lateral walls of said photolithographic mask is also removed.

8. A process according to claim 6 wherein said photoresist development solution comprises NaOH.

9. A process according to claim 8, wherein a lateral profile of said opposite portions next to the channel region forms an angle $\alpha_m$ smaller than 6° with an upper surface of said amorphous silicon layer.

10. A process according to claim 1 wherein said amorphous silicon layer has a thickness comprised between 20 and 200 nm.

11. A process according to claim 1 wherein said heavily doped amorphous silicon layer has a thickness comprised between 5 and 30 nm.

12. A process according to claim 1 wherein said heavily doped amorphous silicon layer has a concentration higher or equal to $10^{19}$ at/cm$^3$.

13. A process according to claim 1 wherein said heavily doped amorphous silicon layer is an n-type.

14. A process according to claim 1 further comprising:
   forming an insulating layer with contact vias aligned with said source/drain regions;
   forming a conductive layer on said insulating layer and in said contact vias; and
   forming a gate electrode and contacts by selectively removing sad conductive layer.

15. A process according to claim 14 wherein said conductive layer is formed by a metallic layer.

16. A process according to claim 1 wherein said substrate is made of glass.

17. A process, comprising:
   forming on a substrate a heavily doped amorphous silicon layer at a temperature lower than or equal to 120° C.; and
   selectively removing portions of said heavily doped amorphous silicon layer using a photoresist development solution,
   said substrate being formed by a material that cannot be etched by the photoresist development solution.

18. A process according to claim 17, wherein before selectively removing said portions of the heavily doped amorphous silicon layer the process comprises:
   forming a layer of photolithographic material on said heavily doped amorphous silicon layer;
   selectively exposing portions of said layer of photolithographic material to a luminous source; and
   removing said portions of said layer of photolithographic material using said photoresist development solution, wherein said photoresist development solution also removes said portions of the heavily doped amorphous silicon layer to define opposite portions that are spaced apart from one another.

19. A process according to claim 17, further comprising forming an amorphous silicon layer between the heavily doped amorphous silicon layer and the substrate, wherein a lateral profile of said opposite portions forms an angle $\alpha$ smaller than 45° with an upper surface of said amorphous silicon layer.

20. A process according to claim 17 wherein said heavily doped amorphous silicon layer is formed through PECVD with temperature lower than or equal to 120° C.

21. A process according to claim 17 wherein said heavily doped amorphous silicon layer has a thickness comprised between 5 and 30 nm.

22. A process according to claim 17 wherein said heavily doped amorphous silicon layer has a dopant concentration higher than or equal to $10^{19}$ at/cm$^3$.

23. A process according to claim 17 wherein said photoresist development solution comprises NaOH.

24. A process, comprising:
forming an amorphous silicon layer;
forming on the amorphous silicon layer a heavily doped amorphous silicon layer;
defining a first portion of the heavily doped amorphous silicon layer, the defining including selectively removing part of said heavily doped amorphous silicon layer using a photoresist development solution; and
forming a polycrystalline silicon region from a first portion of the amorphous silicon layer by carrying out a diffusion and activation step of dopant contained in said first portion of said heavily doped amorphous silicon layer into said first portion of the amorphous silicon layer.

25. A process according to claim 24, wherein the defining includes:
forming a layer of photolithographic material on said heavily doped amorphous silicon layer;
selectively exposing portions of said layer of photolithographic material to a luminous source; and
removing said portions of said layer of photolithographic material using said photoresist development solution.

26. A process according to claim 24, wherein a lateral profile of said first portion of the heavily doped amorphous silicon layer forms an angle α smaller than 45° with an upper surface of said amorphous silicon layer.

27. A process according to claim 24 wherein said heavily doped amorphous silicon layer is formed through PECVD with temperature lower than or equal to 120° C.

28. A process according to claim 24 wherein said photoresist development solution comprises NaOH.

29. A process according to claim 24 wherein:
defining the first portion of the heavily doped amorphous silicon layer also defines a second portion of the heavily doped amorphous silicon layer; and
forming the first polycrystalline silicon region also forms a second polycrystalline silicon region from a first portion of the amorphous silicon layer, wherein the first and second polycrystalline silicon regions are source/drain regions of a thin film transistor.

* * * * *